INVENTOR.
William H. Liederbach
BY
W. S. Hill
AGENT

INVENTOR.
William H. Liederbach
BY
W. S. Hill
AGENT

Feb. 6, 1973 W. H. LIEDERBACH 3,714,709

METHOD OF MANUFACTURING THICK-FILM HYBRID INTEGRATED CIRCUITS

Filed July 6, 1970 3 Sheets-Sheet 3

INVENTOR.
William H. Liederbach
BY
W. S. Hill
AGENT

United States Patent Office 3,714,709
Patented Feb. 6, 1973

3,714,709

METHOD OF MANUFACTURING THICK-FILM HYBRID INTEGRATED CIRCUITS

William Herman Liederbach, Carmel, Ind., assignor to RCA Corporation, New York, N.Y.

Filed July 6, 1970, Ser. No. 52,538
Int. Cl. B41m *3/08;* H05k *3/00*
U.S. Cl. 29—626 6 Claims

ABSTRACT OF THE DISCLOSURE

Method comprises: (1) screen printing on a ceramic substrate a pattern of conductors, resistors and sometimes capacitors and inductors; (2) firing to cure these components; (3) covering the fired components and substrate with a thin layer of a resin composition which is relatively pure, soft, elastic, and non-brittle, leaving openings in the layer where discrete active components are to be mounted and where jumper connections are to be made; (4) mounting the active components within some of these openings and making screen-printed jumper connections between other openings; and (5) encapsulating in an outer layer of a tough, good thermal conducting, moisture resistant, tightly adherent type resin composition.

BACKGROUND OF THE INVENTION

Figure 1:
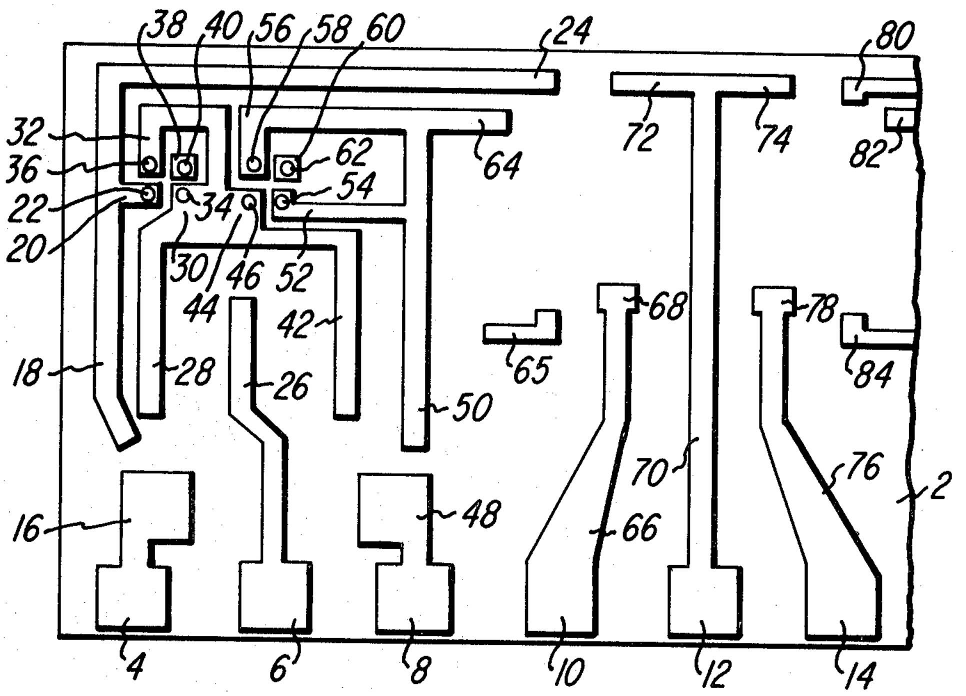

Miniaturized, so-called "hybrid" electronic circuits usually comprise a flat ceramic substrate containing conductors formed by screen printing metallizing inks on the substrate surface. Resistors, also usually formed by screen printing resistive compositions, and other components are mounted on terminals of the conductors. Sometimes, capacitors and inductors are also formed by screen printing instead of by attaching discrete devices. These circuits usually include semiconductor chips containing diodes, transistors or entire circuit portions. These components are separately mounted on the ceramic substrate and connected to the screened-on portions of the circuit. Ceramic capacitors are also sometimes mounted separately.

All of these components must be suitably protected from mechanical handling damage and from deterioration due to atmospheric influences such as moisture. When the circuits were quite small in area (i.e., one square inch or less), it was possible to place the substrate inside a hermetically sealed container at reasonable cost.

However, the size of the circuits has increased so that many of them now occupy several square inches of area and heat dissipation requirements are correspondingly greater. For the larger size circuits intended for industrial or home instrument use, the cost of encapsulation in a hermetically sealed container becomes prohibitive. As the length of the hermetic seal or moisture barrier increases, the probability of a leak occurring multiplies much faster.

Attempts have been made to circumvent the sealing problem by resorting to encapsulation in glasses or synthetic resins instead of hermetic sealing in a metal container. Glasses are not entirely suitable, however, since elevated temperatures are required to fuse them and apply them to the circuit module. These temperatures usually change some of the electrical characteristics of the circuit components and not always by predictable amounts. There is also the problem of matching temperature coefficients of expansion of the components with the glass so that cracking will not occur.

Because of the difficulties with glass encapsulation, circuit makers have turned to synthetic resins. These materials are easily applied at low cost and can be selected to have a wide range of properties depending upon needs of the product in which they are to be used.

In manufacturing many types of hybrid circuits, a number of particular problems must be solved in an economical manner. For example, there is the problem of making connections between all components without shorting any leads and not having some leads which are so long that they introduce too much added resistance into the circuit. This has often required that some leads cross over other leads with insulation between them. Heretofore, this problem has usually been solved by depositing small patches of insulating material where each cross-over is to be made, which, of course, introduces an extra manufacturing step and added cost. It would be desirable to eliminate this extra step.

Another problem is that of mounting the discrete components so that they are electrically connected to the proper circuit leads. This usually entails either a soldering operation or use of a conductive plastic composition. In either case, there are the accompanying problems of precise placement of the electrodes and unwanted spreading of the soldering composition to short out other closely adjacent leads.

Still another problem is that of trimming screen-printed resistors and capacitors to bring them within the tolerance range when they are outside the range as deposited. If the trimming is done before encapsulation, some of the abrasive material may damage other parts of the circuit. If done after encapsulation, the cut-away area must be filled in with a separate application of resin.

Epoxy resins have previously been widely used for encapsulating electronic components because of their excellent resistance to moisture penetration and because of their unusually strong adherence to ceramic and metal surfaces. The latter property inhibits leakage of air and moisture where metal leads emerge from the encapsulated unit. However, in making hybrid circuits it has now been found that if the epoxy resin is in direct contact with components such as screen-printed capacitors and resistors, impurities in the resin can migrate into the circuit component and change the electrical characteristics.

OBJECTS OF THE INVENTION

One object of the present invention is to provide an improved method of mounting discrete components in a thick-film hybrid type integrated circuit which is being encapsulated in synthetic resin compositions.

Another object of the invention is to provide an improved method of manufacturing hybrid circuits which include cross-over connections.

A further object of the invention is to provide an improved method of manufacturing thick-film hybrid circuits which include screen-printed resistors and capacitors.

SUMMARY OF THE INVENTION

Briefly, the improved hybrid circuit manufacturing method of the present invention comprises (1) screen printing on the substrate all of the conductors and components which can be screen printed; (2) separately firing after each type of component or conductor is printed; (3) covering these with a thin layer of a resin composition which is relatively pure, soft, elastic, and non-brittle, leaving openings in the layer where discrete active components are to be mounted and where jumper connections are to be made; (4) mounting the discrete components within some of these openings and making screened on jumper connections between others of these openings; and (5) encapsulating in an outer layer of an epoxy or other tough, adherent, moisture penetration-resistant type resin composition.

THE DRAWINGS

FIGS. 1–5 are top plan views showing successive stages in manufacturing a thick-film hybrid circuit in accordance with the method of the present invention.

DESCRIPTION OF THE PREFERRED EMBODIMENTS

Figure 2:
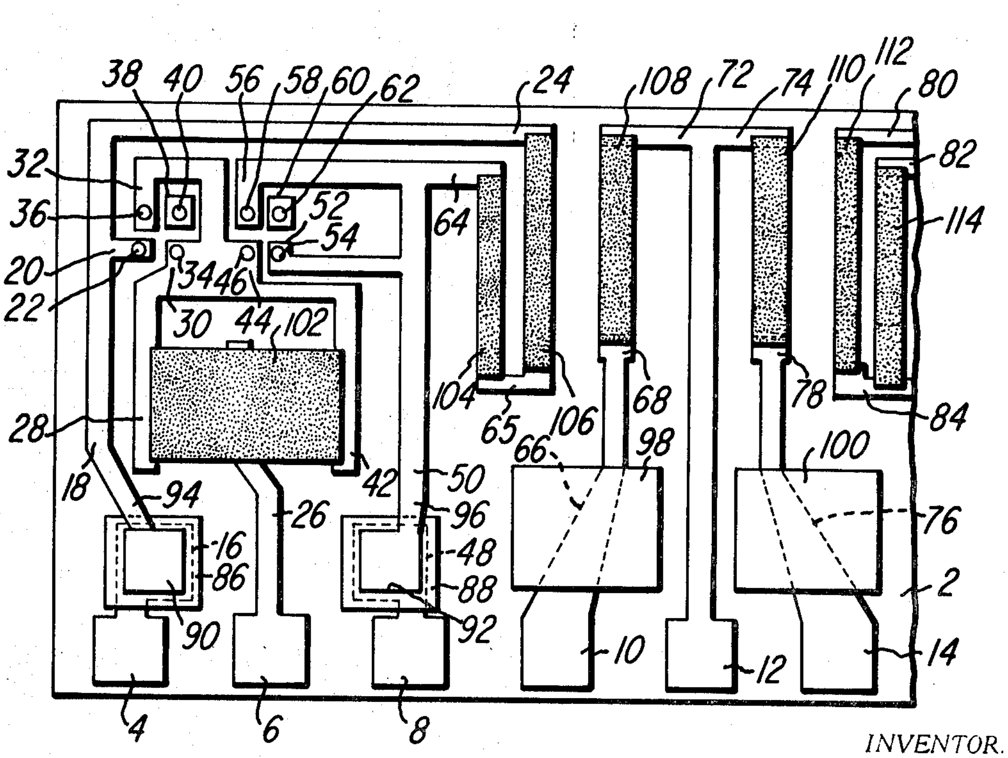

The invention wil lbe described in connection with manufacturing a color diode demodulator circuit, part of which is shown in FIGS. 1 and 2. However, the method can be applied to the making of innumerable circuits.

The circuit utilizes a ceramic substrate 2 which may be about 85–96% alumina, or primarily beryllia, for example. However, the substrate may be any composition which is heat resistant, a good thermal conductor, has a low dielectric constant and is electrically insulating. One of the first steps in making the circuit consists in screen printing a pattern of electrical conductors on the substrate. These conductors may be made from a composition comprising more than 50% by (dry) weight of powdered silver and palladium (having a silver to palladium ratio of between 3:1 and 1:1, for example), about 30–40% by weight of a glass frit (such as a borosilicate glass), a few percent by weight of an organic binder such as ethyl cellulose and sufficient solvent, such as ethyl or butyl Carbitol acetate, to make a printing composition of desired viscosity. After screen printing the pattern, the printed areas are allowed to dry to remove the solvent. Next, the assembly is fired to burn off the organic binder and fuse the glass frit.

As shown in FIG. 1, the completed pattern of conductors includes a series of terminal pads 4, 6, 8, 10, 12 and 14 along one edge of the substrate 2. Terminal pad 4 is connected to the bottom electrode 16 of a capacitor.

Adjacent an edge of the capacitor electrode 16 is a lead 18 which has a branch 20 which is to become one of the connections to a diode. The branch 20 has a solder dot 22 which will be joined to a similar solder dot on one of the diode electrodes. Another branch 24 of the lead 18 will be connected to one end of a resistor.

Terminal pad 6 is conected to a lead 26 part of which will become a terminal common to a pair of resistors. Another lead 28 will become the other terminal of one of the resistors. This lead 28 is connected to a pair of diode connections 30 and 32 having solder dots 34 and 36, respectively. Also helping to support the diode is another connection 38 having solder dot 40. This connection has no electrical function.

The type of diode mount described above is intended to be used with a particular type of planar transistor being connected as a diode. The connection 20 will be connected to the base electrode of the transistor and the connections 30 and 32 will be connected to the collector electrode of the transistor.

Lead 42 is to become a connection to the other resistor of the resistor pair referred to above. This lead is connected to a connection 44 of a second diode. The diode connection has a solder dot 46.

Terminal pad 8 is connected to the bottom electrode 48 of a second screen-printed capacitor. Adjacent the capacitor electrode 48 is another lead 50 having a first branch 52, with solder dot 54, which is also to serve as a connection to the second diode. A second branch 56 (and solder dot 58) of the lead 50 will serve as a third connection to the second diode. The second diode also has another non-functional support connection 60 with solder dot 62.

The lead 50 has a third branch 64 which will be cnnected to one end of a resistor. An isolated terminal 65 will be connected as a common terminal to the two resistors which are also connected at their opposite ends to branches 24 and 64.

Terminal pad 10 is connected to a lead portion 66 which will become the bottom connection to a first ceramic chip capacitor. Then lead portion 66 is, in turn, connected to a terminal portion 68 which will be connected to one end of a resistor.

Terminal pad 12 is connected to a lead 70 which has resistor connection branches 72 and 74.

Terminal pad 14 is connected to a lead portion 76 which will become the bottom connection to a second ceramic chip capacitor. The lead portion 76 is, in turn, connected to a terminal portion 78 of another resistor, the opposite end of which will be connected to branch 74.

Terminal connections 80, 82 and 84 will later be connected to additional resistors.

FIG. 2 illustrates several manufacturing steps. One of these is to deposit dielectric layers 86 and 88 over lower capacitor electrodes 16 and 48, respectively. This can be done by screen printing a ceramic composition. The capacitors are completed by screen printing top electrodes 90 and 92 over dielectric layers 86 and 88, respectively. Then top electrode 90 is connected to lead 18 by a bridging lead portion 94 and top electrode 92 is similarly connected to lead 50 with a lead portion 96. After the metallizing operation, the assembly is again fired to fuse the glass frit, burn off organic binder, and mature the ceramic.

Next, all of the resistors are screen printed. If all the resistors are of the same ink composition, they can all be printed in a single operation. A dual resistor 102 is printed across the middle electrode connection 26 and overlaps the two end connections 28 and 42. A resistor 104 bridges connections 64 and 65. A resistor 106 bridges connections 24 and 65. A resistor 108 is deposited between connections 68 and 72. A resistor 110 is deposited between connections 74 and 78. A resistor 112 is deposited between connections 80 and 84. And a resistor 114 is printed between connections 82 and 84. These resistors may be composed of the same ingredients as the conductive inks described above but with a lower proportion of powdered metal and higher proportion of glass frit. After the resistors are deposited, the unit goes through a firing operation to fuse the glass frit and burn off organic binder.

Another operation performed at this time (after the firing step) is to attach the bottom electrodes of ceramic capacitors 98 and 100 to lead portions 66 and 76, respectively. This can be done by using a conductive cement composed of an epoxy resin and silver powder.

The reason for separate firing operations for the highly conductive metallizing inks and the resistor inks is that each of these materials requires a different maximum firing temperature to cure it or mature it.

Figure 3:
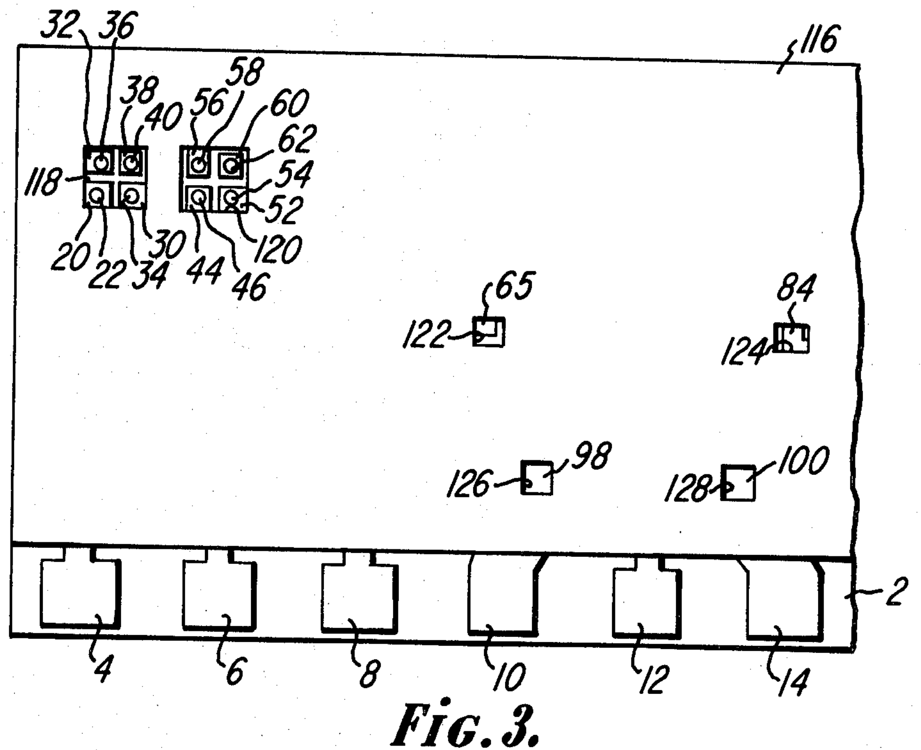

The next step in the method is an important feature of the present invention. As illustrated in FIG. 3, this step comprises screen printing a thin layer of synthetic resin composition 116 over the ceramic substrate 2 and over the pattern of conductors and circuit components previously deposited and attached, except for certain windows which will be pointed out below. This resin layer is not intended to provide complete, long-term protection against atmospheric influences such as would be provided with a relatively thick layer of epoxy resin. But this layer does have a number of important functions.

Since it has now been found that epoxy resins usually introduce impurities into circuit components, which can cause undesirable changes in their electrical characteristics, this layer of resin is selected to be of a relatively pure grade to greatly lessen such contamination.

The resin layer 116 can also be used as the substrate for any jumper connections needed between circuit components instead of resorting to separately screened on patches of dielectric.

The layer also serves as a protection for the remainder of the circuit when one or more of the resistor and/or screen-printed capacitors must be adjusted by abrasive trimming. Ordinarily, this trimming operation causes abrasive particles to be carried to other parts of the circuit and these often cause unwanted circuit damage.

As shown in FIG. 3, the layer 116 does not cover the terminal pads 4 to 14 since these must be left uncovered for subsequent attachment of lead wires. Also provided in the resin layer are windows 118 and 120 to permit mounting of diodes. Another window 122 is provided over the resistor terminal 65. A window 124 is also provided over resistor terminal 84. Other windows 126 and 128 are provided over the top electrodes of capacitors 98 and 100, respectively.

The resin selected for the layer 116 is one which is relatively pure, also soft and resilient. Its adhesive properties are not as strong as those of the epoxies. Examples of this type of resin are silicones, diallyl phthalate, polyimides and polyurethanes. An example of a specific composition which may be used is as follows:

| | Gms. |
|---|---|
| Silicone resin (DC805 of Dow Corning Corp.) | 100 |
| Mica flake (FF325 English Mica Co., Kings Mountain, N.C., high purity grade capable of passing through a 325 mesh screen) | 50 |
| Butyl Carbitol acetate (solvent for the resin) | 50 |
| Wetting agent (DCFS 1265/1000 of Dow Corning Corp.) a fluorocarbon silicone oil | .04 |

The composition is prepared by thoroughly milling the ingredients.

The mica flake (or other filler such as talc) and the solvent, may each be varied in the same proportion between about 50 gms. and 10 gms. per 100 gms. of resin. That is, the solvent is usually in about the same ratio by weight to the resin as the filler is to the resin. Fillers used should be high purity grades.

The soft and resilient type resins should be used in this layer so that the resistors and capacitors will not tend to be lifted off the substrate due to strains which occur during changes in temperature.

Filler is used to impart better heat conducting properties to the layer. If mica flake is used as the filler, the layer remains transparent, which is sometimes an advantage if changes or corrections to the circuit components must be made.

After the resin layer is hardened, resistors and capacitors may be trimmed if this is necessary. The presence of the resin layer prevents abrasive from the trimming operation damaging other parts of the circuit.

Figure 4:
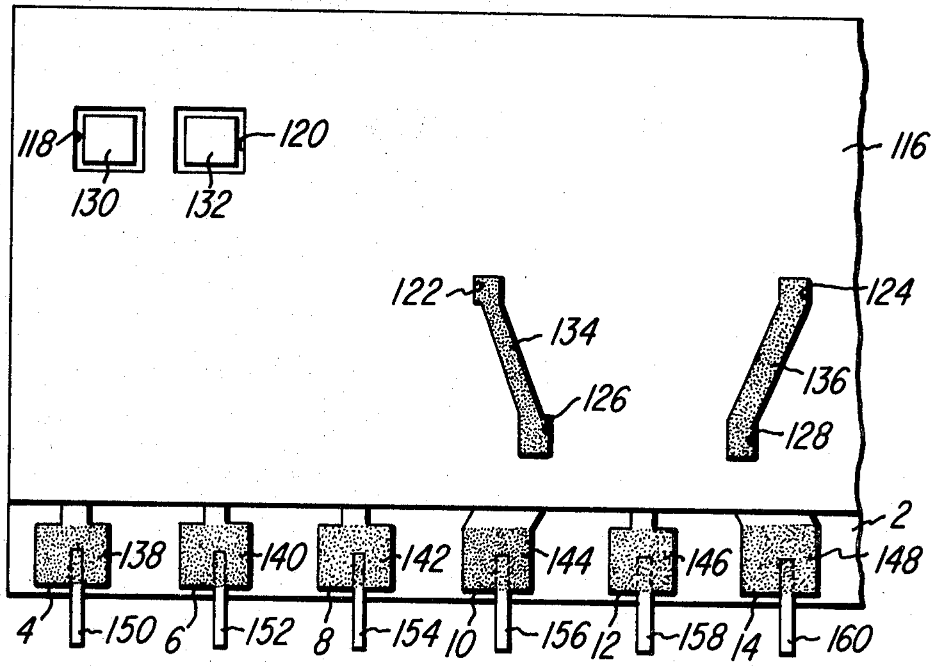

FIG. 4 illustrates additional functions of the layer 116. As shown in this figure, diodes 130 and 132 are mounted face down in windows 118 and 120, respectively. The diode 130 is mounted by matching solder dots on the device to the solder dots 22, 34, 36 and 40 on the conductive pattern on the substrate. Similarly, diode 132 is mounted on solder dots 46, 54, 58 and 62. The walls of the windows 118 and 120 prevent solder from flowing along the conductors and possibly shorting to adjacent conductors. The fact that the solder cannot flow also causes the mounted devices to stand off from the substrate surface and thus leave a space for cleaning out flux.

In order to make a jumper connection between chip capacitor 98 and resistor terminal 65, a ribbon 134 of metallizer ink is screen printed between and down into windows 126 and 122 on the resin layer 116. Similarly, to connect capacitor 100 and resistor terminal 84, a ribbon 136 of metallic ink is screen printed between and down into windows 128 and 124. Thus, the protective layer 116 serves additionally as a substrate for metal connectors of the circuit.

Also, at this stage of the operation, solder layers 138, 140, 142, 144, 146 and 148 are applied to terminaal pads 4, 6, 8, 10, 12 and 14, respectively, and external lead wires 150, 152, 154, 156, 158 and 160 are soldered thereto.

Figure 5:
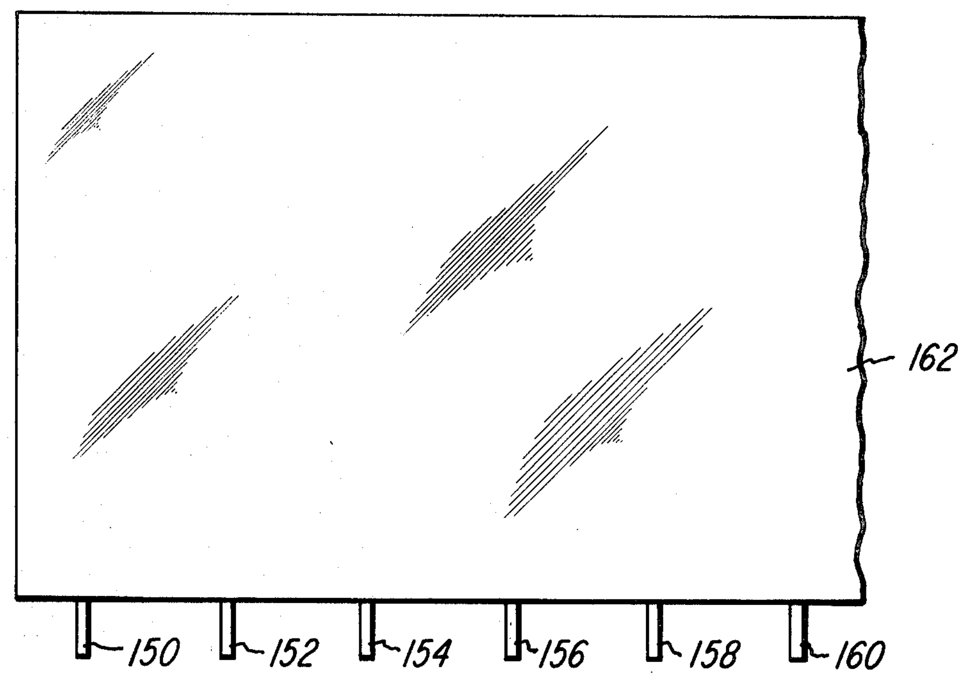

The assembly is now ready for a final encapsulation. As shown in FIG. 5, this may be done by applying a relatively thick layer of epoxy resin 162 over the entire unit except ends of lead wires 150, 152, 154, 156, 158 and 160. The epoxy resin is a relatively hard, tough resin that resists mechanical damage and has good resistance to moisture penetration. The epoxy resin is usually loaded with a filler such as silica or talc or alumina to give it better heat conductive properties.

Although not absolutely necessary, the jumper connections 134 and 136 may first be covered with some of the same resin composition as the layer 116 before applying the encapsulation layer 162.

What is claimed is:

1. A method of making a hybrid circuit comprising:
- depositing on an electrically insulating, good thermally conducting, low dielectric constant substrate a pattern of electrical conductors and passive circuit components connected thereto,
- covering said substrate and said components with a thin layer of a relatively pure, soft, elastic resin composition, leaving openings therein at predetermined locations,
- depositing on said resin layer, conductive ribbons constituting jumper connections between circuit portions, said ribbons extending through some of said openings,
- mounting active circuit components within others of said openings, all connections to said components being on said substrate, and
- covering said thin resin layer, said openings and said conducting ribbons with a relatively thick encapsulation of a relatively hard, tough, adherent resin.

2. A method according to claim 1 in which said jumper connections are made by screen printing a metallizing ink on said thin resin layer.

3. A method according to claim 1 in which said active components are mounted by soldering electrodes to said conductor pattern.

4. A method according to claim 1 in which said pattern of electrical conductors is deposited by screen printing a metallizing ink.

5. A method of making a hybrid circuit comprising:
- depositing on an electrically insulating, good thermally conducting, low dielectric constant substrate a pattern of electrical conductors and passive circuit components connected thereto,
- covering said substrate and said components with a thin layer of a relatively pure, soft, elastic resin composition, leaving openings therein at predetermined locations,
- abrasively trimming at least some of said passive circuit components after said thin resin layer is deposited,
- depositing on said resin layer, conductive ribbons constituting jumper connections between circuit portions, said ribbons extending through some of said openings,
- mounting active circuit components within others of said openings, and
- covering said thin resin layer, said openings and said conductive ribbons with a relatively thick encapsulation of a relatively hard, tough, adherent resin.

6. A method according to claim 1 in which said hard, tough resin is an epoxy.

References Cited

UNITED STATES PATENTS

| | | | |
|---|---|---|---|
| 3,489,952 | 1/1970 | Hinchey | 264—272 X |
| 2,779,975 | 2/1957 | Lee et al. | 29—625 |
| 2,721,153 | 10/1955 | Hopf et al. | 29—625 U X |
| 3,560,256 | 2/1971 | Abrams | 29—625 X |
| 3,622,384 | 11/1971 | Davey | 29—625 X |

OTHER REFERENCES

Printed and Integrated Circuitry by Schlabach and Rider, pp. 187–190.

RICHARD J. HERBST, Primary Examiner

R. W. CHURCH, Assistant Examiner

U.S. Cl. X.R.

174—68.5; 117—212; 29—589, 591; 317—101 CA